United States Patent
Rohde et al.

(10) Patent No.: US 7,545,229 B2
(45) Date of Patent: Jun. 9, 2009

(54) TUNABLE FREQUENCY, LOW PHASE NOISE AND LOW THERMAL DRIFT OSCILLATOR

(75) Inventors: Ulrich L. Rohde, Upper Saddle River, NJ (US); Ajay Kumar Poddar, Fairlawn, NJ (US)

(73) Assignee: Synergy Microwave Corporation, Paterson, NJ (US)

( * ) Notice: Subject to any disclaimer, the term of this patent is extended or adjusted under 35 U.S.C. 154(b) by 18 days.

(21) Appl. No.: 11/657,363

(22) Filed: Jan. 24, 2007

(65) Prior Publication Data

US 2007/0120615 A1    May 31, 2007

Related U.S. Application Data

(62) Division of application No. 10/912,209, filed on Aug. 5, 2004, now Pat. No. 7,196,591.

(60) Provisional application No. 60/563,481, filed on Apr. 19, 2004, provisional application No. 60/528,670, filed on Dec. 11, 2003, provisional application No. 60/527,957, filed on Dec. 9, 2003, provisional application No. 60/501,790, filed on Sep. 10, 2003, provisional application No. 60/501,371, filed on Sep. 9, 2003, provisional application No. 60/493,075, filed on Aug. 6, 2003.

(51) Int. Cl.
   *H03B 5/12*    (2006.01)
(52) U.S. Cl. .................... 331/176; 331/117 R
(58) Field of Classification Search ............. 331/176, 331/117 R
See application file for complete search history.

(56) References Cited

U.S. PATENT DOCUMENTS

| | | | |
|---|---|---|---|
| 2,502,488 A | 4/1950 | Shockley |
| 2,524,035 A | 10/1950 | Bardeen et al. |
| 3,373,379 A | 3/1968 | Black |
| 3,624,550 A | 11/1971 | Vane |
| 4,435,688 A | 3/1984 | Shinkawa et al. |
| 4,479,259 A | 10/1984 | Fenk et al. |
| 4,527,130 A | 7/1985 | Lutteke |
| 4,619,001 A | 10/1986 | Kane |
| 4,621,241 A | 11/1986 | Kiser |
| 4,633,197 A | 12/1986 | Vanderspool, II |
| 4,661,785 A | 4/1987 | Benjaminson |
| 4,692,714 A | 9/1987 | Galani |

(Continued)

FOREIGN PATENT DOCUMENTS

DE    3443446 A    5/1986

(Continued)

OTHER PUBLICATIONS

A. K. Poddar and K. N. Pandey, "Microwave Switch using MEMS technology,"8th IEEE International Symposium, EDMO-2000, pp. 134-139, Nov. 2000, UK.

(Continued)

*Primary Examiner*—Joseph Chang
(74) *Attorney, Agent, or Firm*—Lerner, David, Littenberg, Krumholz & Mentlik, LLP

(57) ABSTRACT

An oscillator comprising a three-terminal device and circuitry coupled across a first terminal and a second terminal of the device. The circuitry is preferably operable to bias the device and feedback a select amount of noise generated by the device into the device so as to reduce a proportional amount of phase noise present at a third terminal of the device.

18 Claims, 11 Drawing Sheets

U.S. PATENT DOCUMENTS

| | | | |
|---|---|---|---|
| 4,812,784 | A | 3/1989 | Chung et al. |
| 4,868,526 | A | 9/1989 | Camiade et al. |
| 5,041,799 | A | 8/1991 | Pirez |
| 5,223,801 | A | 6/1993 | Bergman |
| 5,231,361 | A | 7/1993 | Smith et al. |
| 5,373,264 | A | 12/1994 | Higgins |
| 5,402,087 | A | 3/1995 | Gorczak |
| 5,434,542 | A | 7/1995 | Veith et al. |
| 5,650,754 | A | 7/1997 | Joshi et al. |
| 5,661,439 | A | 8/1997 | Watkins et al. |
| 5,748,051 | A | 5/1998 | Lewis |
| 5,854,578 | A | 12/1998 | Minasi et al. |
| 5,900,788 | A | 5/1999 | Hagemeyer |
| 6,124,767 | A | 9/2000 | Woods |
| 6,172,577 | B1 | 1/2001 | Oe et al. |
| 6,242,843 | B1 | 6/2001 | Pohjonen et al. |
| 6,297,708 | B1 | 10/2001 | Lemay |
| 6,326,854 | B1 | 12/2001 | Nicholls et al. |
| 6,392,452 | B2 | 5/2002 | Lee et al. |
| 6,489,853 | B1 | 12/2002 | Lewis |
| 6,624,726 | B2 | 9/2003 | Niu |
| 6,630,869 | B2 | 10/2003 | Flynn et al. |
| 6,714,088 | B2 | 3/2004 | Chang |
| 6,714,772 | B2 | 3/2004 | Kasahara et al. |
| 6,731,181 | B2 | 5/2004 | Fukayama et al. |
| 6,734,745 | B2 | 5/2004 | Sakai |
| 6,737,928 | B2 | 5/2004 | Kubo et al. |
| 6,825,734 | B2 | 11/2004 | Clark |
| 7,061,333 | B2 | 6/2006 | Aikawa et al. |
| 7,088,189 | B2 | 8/2006 | Rohde et al. |
| 7,180,381 | B2 | 2/2007 | Rohde et al. |
| 7,262,670 | B2 | 8/2007 | Rohde et al. |
| 7,292,113 | B2 | 11/2007 | Rohde et al. |
| 2001/0004225 | A1 | 6/2001 | Nicholls et al. |
| 2001/0030583 | A1 | 10/2001 | Ikarashi |
| 2001/0035794 | A1 | 11/2001 | Fujidai et al. |
| 2002/0084860 | A1 | 7/2002 | Festag et al. |
| 2003/0160660 | A1 | 8/2003 | Chang et al. |
| 2004/0095197 | A1 | 5/2004 | Wang et al. |
| 2004/0113707 | A1 | 6/2004 | Fredriksson |
| 2004/0130402 | A1 | 7/2004 | Marquardt |
| 2004/0222858 | A1 | 11/2004 | Corse et al. |
| 2004/0227578 | A1 | 11/2004 | Hamalainen |
| 2005/0156683 | A1 | 7/2005 | Rohde et al. |
| 2005/0242896 | A1 | 11/2005 | Rohde et al. |
| 2005/0280478 | A1 | 12/2005 | Patel et al. |

FOREIGN PATENT DOCUMENTS

| | | |
|---|---|---|
| EP | 0 800 224 A | 10/1997 |
| EP | 0 823 777 | 2/1998 |
| EP | 0 843 374 A | 5/1998 |
| EP | 1 093 216 A | 4/2001 |
| JP | 59-072205 A | 4/1984 |
| JP | 59-139708 A | 8/1984 |
| WO | WO-02/17476 A | 2/2002 |
| WO | WO-02/005416 A1 | 11/2002 |
| WO | WO-2005/015731 | 2/2005 |

OTHER PUBLICATIONS

A. K. Poddar, S.K. Koul, and B. Bhat, "Millimeter Wave Evanescent Mode Gunn Diode Oscillator in Suspended Stripline Configuration." 22nd international Conference on Millimeter Waves, pp. 265-266, Jul. 1997.

A. M. Elsayed and M. I. Elmasry,"Low-Phase-Noise LC Quadrature VCO using Coupled Tank Resonators in Ring," IEEE, JSSC, vol. 36, pp. 701-705, Apr. 2001.

A. Ward and B. Ward, "A Comparison of various Bipolar Transistor Biasing Circuits," Applied Microwave & Wireless, vol. 13, pp. 30-52, 2001.

A.V. Grebennikov, "Microwave Transistor Oscillators: an Analytic Approach to Simplify Computer-Aided Design", Microwave Journal, pp. 294-299, May 1999.

Amir Mortazawi, Heinrich D. Foltz, and Tatsuo Itoh, "A Periodic Second Harmonic Spatial Power Combining Oscillator", IEEE, MTT, vol. 40, pp. 851-856, May 1992.

Andrea Borgioli, Pochi Yeh, and Robert A. York, "Analysis of Oscillators with External Feedback Loop for Improved Locking Range and Noise Reduction," IEEE Trans. MTT, vol. 47, pp. 1535-1543, Aug. 1999.

Andrew V. Grebennikov, "Microwave FET Oscillators: an Analytic Approach to Simplify Computer-Aided Design", Microwave journal, pp. 102-111, Jan. 2000.

B. Van der Pol, "The Nonlinear Theory of Electrical Oscillators,"Proc. IRE, vol. 22 No. 9, pp. 1051-1086, Sep. 1934.

Byeong-Ha Park, "A Low-Voltage, Low Power, CMOS 900 MHz Frequency Synthesizer," Ph.D. Dissertation, Georgia Institute of Technology, Dec. 1997.

C. Arnaud, D. Basataud, J. Nebus, J. Teyssier, J. Villotte, D. Floriot, "An Active Pulsed RF and Pulsed DC Load-Pull System for the Characterization of HBT Power Amplifiers Used in Coherent Radar and Communication Systems," IEEE Transactions on Mfl, vol. 48, No. 12, pp. 2625-2629, Dec. 2000.

D. B. Leeson, A Simple Model of Feedback Oscillator Noise Spectrum, Proc. IEEE, pp. 329-332, 1966.

D. Ham, A. Hajimiri, "Concepts and Methods in Optimization of Integrated LCVCOs," IEEE Journal of Solid-state Circuits, Jun. 2001.

Douglas R. Jachowski, "Passive Enhancement of Resonator Q in Microwave Notch Filters", IEEE MTT-S Digest, pp. 1315-1318, Jun. 2004.

E. Hegazi, H. Sjoland, and A. Abidi, "A Filtering Technique to Lower LC Oscillator Phase Noise," IEEE J. Solid-State Circuits, vol. 36, pp. 1921-1929, Dec. 2001.

F. X. Sinnesbichier, B Hauntz and 0. R. Olbrich, "A Si/SiGe HBT Dielectric Resonator Push-Push Oscillators at 58 GHz," IEEE Microwaved Guided Wave Lett. vol. 10, pp. 145-147, Apr. 2000.

F. X. Sinnesbichler and 0. R. Olbrich, "SiGe HBT Push-Push Oscillators for V-Band Operation," IEEE MTT-S silicon Monolithic Integrated Circuits in RF Systems Symp., Garmisch, Germany, Apr. 26-28, 2000, pp. 55-59.

F. X. Sinnesbichler, B. Hautz, G. R. Olbrich, "A Low Phase Noise 58 GHz SiGe HBT Push-Push, Oscillator with Simultaneous 29 GHz Output", IEEE, MTT-S Digest, pp. 35-38, 2000.

F. X. Sinnesbichler, H. Geltinger, and G. R. Olbrich, "A 38 0Hz Push-Push Oscillator Based on 25 GHz-fT BJTs," IEEE Microwave Guided Wave Lett. vol. 9 pp. 151-153, Apr. 1999.

F.M. Ghannouchi, R. Larose, R.G. Bosisio, "A New Multi-harmonic Loading Method for Large-Signal Microwave and Millimeter-Wave Transistor Characterization," IEEE Transactions on MTT, vol. 39, No. 6, pp. 986-992, Jun. 1991.

Franco Ramirez, Jose Lius Garcia H., Tomas Fernandez and Almudena Suarez,"Nonlinear Simulation Techniques for the Optimized Design of Push-Push Oscillators", IEEE, MTT-S Digest, pp. 2157-2160, 2003.

Franz X. Sinnesbichier, "Hybrid Millimeter-Wave Push-Push Oscillators Using Silicon-Germanium HBTs,"IEEE MTT-S, vol. 51, Feb. 2003.

H. Abe, Y. Aono, 11 GHz GaAs Power MESFET Load-Pull Measurements Utilizing a New Method of Determining Tuner Y-Parameters, IEEE Transactions on Microwave Theory and Techniques, vol. 27, No. 5, pp. 394-399, May 1979.

H. Stark, and J. W. Woods, Probability, Random Processes, and Estimation Theory for Engineers. New York: Prentice-Hall, 1986.

H.C. Chang,"Phase noise self-injection-locked oscillators- Theory and experiment, "IEEE Transactions on Microwave Theory and Techniques, vol. 51, No. 9, pp. 1994-1999, Sep. 2003.

Hai Xiao, Takayuki Tanka and Masayoshi Aikawa, "A Ka-Brand Quadruple-Push Oscillator", IEEE, MTT-S Digest, pp. 889-892, 2003.

Heng-Chia Chang, "Analysis of Coupled Phase-Locked Loops With Independent Oscillators for Beam Control Active Phased," IEEE Trans. MTT, vol. 52, pp. 1059-1065, Mar. 2004.

Heng-Chia Chang, Xudong Cao, Mark J. Vaughan, Umesh K. Mishra, and R. York,"Phase Noise in Externally Injection-Locked Oscillator Arrays," IEEE Trans. MTT, vol. 45, pp. 2035-2042, Nov. 1997.

Heng-Chia Chang, Xudong Cao, Umesh K. Mishra, and R. York, "Phase Noise in Coupled Oscillators: Theory and experiment," IEEE Trans. MTT, vol. 45, pp. 604-615, May 1997.

Henkes, Dale D, 'Designing Short High Q Resonators', Design, Dec. 2003, pp. 75-109.

J. C. Nallatamby, M. Prigent, M. Camiade, J. Obregon, "Phase Noise in Oscillators-Leeson Formula Revisited," IEEE Transactions on Microwave Theory and Techniques, vol. 51, No. 4, pp. 1386-1394, Apr. 2003.

J. Everard, Fundamentals of RE Circuit Design with Low Noise Oscillators, John Wiley & Sons. Ltd, 2001.

J. Heinbockel and A. Mortazawi,"A Periodic Spatial Power Combining MESFET Oscillator", IEEE, MTT-S Digest, pp. 545-548, 1992.

J. R. Bender, C. Wong, Push-Push Design Extends Bipolar Frequency Range, Microwave & RF, pp. 91-98, Oct. 1983.

Jeong-Geun Kim, Dong-Hyun Baek, Sang-Hoon Jeon, Jae-Woo Park and Songcheol Hong, A 60 GHz InGaP/GaAs HBT Push-Push MMIC VCO, IEEE, MTT-S Digest, pp. 885-888, 2003.

Jonathan J. Lynch and Robert A. York, "Synchronization of Oscillators Coupled through Narrow-Band Networks," IEEE Trans. MTT, pp. 238-249, Feb. 2001.

Jonathan J. Lynch and Robert A. York, "An Analysis of Mode-Locked Arrays of Automatic Level Control Oscillators," IEEE Trans. on Circuits and Systems-I, vol. 41, pp. 859-865, Dec. 1994.

Jwo-Shiun Sun, "Design Analysis of Microwave Varactor-Tuned Oscillators", Microwave journal, pp. 302-308, May 1999.

K. Poddar, A Novel Approach for Designing Integrated Ultra Low Noise Microwave Wideband Voltage-Controlled Oscillators, Dec. 14, 2004.

K. W. Kobayashi et al., "A 108-0Hz InP-based HBT Monolithic Push-Push VCO with Low Phase Noise and Wide Tuning Bandwidth," IEEE J. Solid-State Circuits, vol. 34, pp. 1225-1232, Sep. 1999.

K.O,"Estimation Methods for Quality Factors of Inductors Fabricated in Silicon Integrated Circuit Process Technologies, "IEEE, JSSS, pp. 1565-1567, Sep. 1997.

Kaneyuki Kurokawa, "Noise in Synchronized Oscillators," IEEE Trans. MTT, vol. 16, pp. 234-240, Apr. 1968.

Kaneyuki Kurokawa, "The Single Cavity Multiple Device Oscillator," IEEE Trans. MTT, vol. 19, pp. 793-801, Oct. 1971.

Klaus F. Schunemann and Karl Behm, "Nonlinear Noise Theory for Synchronized Oscillators," IEEE Trans. MTT, vol. 27, pp. 452-458, May 1979.

L. Dussopt, D. Guillois, and 0. Rebeiz, "A Low Phase Noise Silicon 9 0Hz VCO and an 18 0Hz Push-Push Oscillator, "IEEE MTT-S. Digest, 2002, pp. 695-698.

M. Kuramitsu and F. Takasi, "Analytical method for Multmode Oscillators Using the Averaged Potential,"Elec. Communication Japan, vol. 66-A, pp. 10-19, 1983.

M. Odyniec, Editor, RF and Microwave Oscillator Design, Chapter 3: Linearity, Time Variation, and Oscillator Phase Noise, by T. Lee and A. Hajimiri, Artech House, 2002.

M. Regis, 0. Llopis, and J. Graffeuil, "Nonlinear Modeling and Design of Bipolar Transistor Ultra Low Phase-Noise Dielectric-Resonator Oscillators", IEEE transaction on MTT, vol. 46, No. 10, pp. 1589-1593, Oct. 1998.

M. Schott, H. Kuhnert, J. Hilsenbeck, J. Wurlf, and H. Heinrich, "38 GHz Push-Push GaAs-HBT MMIC Oscillator,"IEEE MTT-S, Digest, 2002, pp. 839-842.

M. Ticbout,"Low power, Low Phase Noise, Differentially Tuned Quadrature VCO Design in Standard CMOS, "IEEE- JSSS, vol. 36, pp. 10 18-1024, Jul. 2001.

M. Vidmar, "A Wideband, Varactor-Tuned Microstrip VCO," Microwave Journal, Jun. 1999.

Mortazawi A and B. C. De Loach, Jr., "Multiple Element Oscillators Utilizing a New Power Combining Technique," in IEEE MTT-S Tnt. Microwave Symp. Dig., 1992, pp. 1093-1096.

P. Berini, M. Desgagne, F.M. Ghannouchi, R.G. Bosisio, "An Experimental Study of the Effects of Harmonic Loading on Microwave MESFET Oscillators and Amplifiers," IEEE Transactions on MTT, vol. 42, No. 6, pp. 943-950, Jun. 1994.

Q. Cai, J. Gerber, S. Peng, "A Systematic Scheme for Power Amplifier Design Using a Multi-Harmonic Load-Pull Simulation Technique," 1998 IEEE MTT-S Symposium Digest, vol. 1, pp. 161-165, Jun. 7-12, 1998.

R. A. York and R.C. Compton,"Mode-Locked Oscillator Arrays", IEEE Microwave and Guided Letter, vol. 1, pp. 215-218, Aug. 1991.

R. A. York, "Nonlinear Analysis of Phase Relationship in Quasi-Optical Oscillator Arrays,"IEEE Trans. Microwave Theory Tech., vol. 41, pp. 1799-1809, Oct. 1993.

R. A. York, P. Liao, and J. J. Lynch, "Oscillator Array Dynamics with Broad-Band N-Port Coupling Networks," IEEE Trans. Microwave Theory Tech., vol. 42, pp. 2040-2045, Nov. 1994.

R. Adler, "A Study of Locking Phenomena in Oscillators," Proc. IEEE, vol. 61, pp. 180-1385, Oct. 1973.

R. G. Freitag, S.H. Lee, D.M. Krafcsik, D.E. Dawson and J. E. Degenford,"Stability and Improved Circuit Modeling Considerations for High Power MMIC Amplifiers", IEEE, MM-Wave Monolithic Circuits Symposium, pp. 2169-2172, 2003.

R. J. Hawkins, "Limitations of Nielsen's and Related Noise Equations Applied to Microwave Bipolar Transistors and a New Expression for the Frequency and Current Dependent Noise Figure," Solid-State Electron., vol. 20 pp. 191-196, 1977.

Reidar L. Kuvas, "Noise in Single Frequency Oscillators and Amplifiers," IEEE Trans. Microwave Theory Tech., vol. MTT-21, pp. 127-134, Mar. 1973.

Ronald G. Freitag, "A United Analysis of MMIC Power Amplifier Stability,"IEEE, MTT-S Digest, pp. 297-300, 1992.

S. Kudszus, W. H. haydi, A. Tessmann, W. Bronner, and M. Schlechtweg, "PushPush Oscillators for 94 and 140 0Hz Applications Using Standard Pseudomorphic GaAs HEMTs,"IEEE MTT-S, Microwave Symp. Digest, 2001, pp. 1571-1574.

Shigeji Nogi, Jenshan Lin and Tatsuo Itoh., Mode Analysis and Stabilization of a Spatial Power Combining Array with Strongly Coupled oscillators, IEEE, MTT, vol. 41, pp. 1827-1837, Oct. 1993.

Shih-Chieh Yen and Tah-Hsiung Chu, "An Nth-Harmonic Oscillator Using an N-Push Coupled Oscillator Array with Voltage-Clamping Circuits", IEEE, MTT-S Digest, pp. 545-548, 1992.

T. H. Hsu and C.P. Snapp, "Low-Noise Microwave Bipolar Transistor with Sub-Half-Micrometer Emitter Width," IEEE Trans. Electron Devices, vol. ED-25, pp. 723-730, Jun. 1978.

U. L. Rohde, "A New and Efficient Method of Designing Low Noise Oscillators," Ph.D. Dissertation, Technical University of Berlin, Feb. 12, 2004.

U. L. Rohde, A. K. Poddar, Juergen Schoepf, Reimund Rebel, and Parimal Patel, "Low Noise Low Cost Wideband N-Push VCO," IEEE, IMS Symposium, MTT2005, USA.

U. L. Rohde, K. Juergen Schoepf, A.K. Poddar, "Low Noise VCOs Conquer Wideband," Microwaves & Rf, pp. 98-106, Jun. 2004.

U.L. Rohde, A Novel RFIC for UHF Oscillators (Invited), 2000 IEEE Radio Frequency Integrated Circuits (RFIC) Symposium, Boston, MA, Jun. 11-13, 2000.

U.L. Rohde, "Improved Noise Modeling of GaAs FETS: Using an Enhanced Equivalent Circuit Technique," Microwave Journal, pp. 87-101—Nov. 1991.

U.L. Rohde, "Parameter Extraction for Large Signal Noise Models and Simulation of Noise in Large Signal Circuits Like Mixers and Oscillators," 23rd European Microwave Conference, Madrid, Spain, Sep. 6-9, 1993.

U.L. Rohde, D.P. Newkirk, RF/Microwave Circuit Design for Wireless Applications, pp. (123-197), John Wiley & Sons, Apr. 2000, ISBN 0-471-29818-2.

W. 0. Schlosser, "Noise in Mutually Synchronized Oscillators," IEEE Trans. Microwave Theory Tech., vol. MTT-16, pp. 732-737, Sep. 1968.

WA. Pucel, W. Struble, R Hallgren, U.L. Rohde, "A General Noise Dc-embedding Procedure for Packaged Two-Port Linear Active Devices," IEEE Transactions on MTT, vol. 40, No. 11, pp. 2013-2024, Nov. 1992.

Wing Shing Chan et al: "The design of oscillators using the cascode circuit" Circuits and Systems, 1994, vol. 5, pp. 689-692, May 30, 1994.

Y. Baeyens et al., "Compact InP-based HBT VCOs with a Wide Tuning Range at W-Band," IEEE Trans. MTT, vol. 48, pp. 2403-2408, Dec. 2001.

Y. Sun, T. Tieman, H. Pflung, and W. Velthius, "A Fully Integrated Dual-Frequency Push-Push VCO for 5.2 and 5.8GHz Wireless Applications," Microwave Journal., pp. 64-74, Apr. 2001.

Yu-Lung Tang and Huei Wang, "Triple-Push Oscillator Approach: Theory and Experiments," IEEE- JSS, vol. 36, pp. 1472-1479, Oct. 2001.

TUNABLE FREQUENCY, LOW PHASE NOISE AND LOW THERMAL DRIFT OSCILLATOR

CROSS REFERENCE TO RELATED APPLICATIONS

The present application is a divisional of U.S. Pat. No. 10/912,209 filed, Aug. 5, 2004 the disclosure of which is hereby incorporated herein by reference. The present application claims the benefit of U.S. Provisional Application Nos. 60/493,075, filed on Aug. 6, 2003, and entitled "Tunable Frequency, Low Phase Noise and Low Thermal Drift Oscillator;" 60/501,371, filed on Sep. 9, 2003, and entitled "Wideband Tunable, Low Noise And Power Efficient Coupled Resonator/Coupled Oscillator Based Octave-band VCO;" 60/501,790, filed on Sep. 10, 2003, and entitled "Wideband Tunable, Low Noise And Power Efficient Coupled Resonator/Coupled Oscillator Based Octave-band VCO;" 60/527,957, filed on Dec. 9, 2003, and entitled "Uniform And User-Definable Thermal Drift Low Noise Voltage Control Oscillator;" 60/528,670, filed on Dec. 11, 2003, and entitled "Uniform And User-Definable Thermal Drift Low Noise Voltage Control Oscillator;" and 60/563,481, filed on Apr. 19, 2004, and entitled "Integrated Ultra Low Noise Microwave Wideband Push-Push VCO," the disclosures of which are hereby incorporated by reference herein.

FIELD OF THE INVENTION

In one aspect, the present invention relates to circuitry for voltage controlled oscillators (VCOs). Preferably, such oscillators have one or more of the following characteristics: thermally stable, ultra-low phase noise performance, and the ability to operate at relatively high frequencies and over an extended frequency range.

BACKGROUND OF THE INVENTION

A voltage controlled oscillator (VCO) is a component that can be used to translate DC voltage into a radio frequency (RF) voltage. The magnitude of the output signal is dependent on the design of the VCO circuit and the frequency of operation is determined by a resonator that provides an input signal. Clock generation and clock recovery circuits typically use VCOs within a phase locked loop (PLL) to either generate a clock from an external reference or from an incoming data stream. VCOs are therefore often critical to the performance of PLLS. In turn, PLLs are essential components in communication networking as the generated clock signal is typically used to either transmit or recover the underlying service information so that the information can be used for its intended purpose. PLLs are particularly important in wireless networks as they enable the communications equipment to quickly lock-on to the carrier frequency onto which communications are transmitted.

In this regard, the dynamic operating range and noise performance of a VCO may limit or affect the performance of the PLL itself. As an example, the operating frequency of a commercially available ceramic resonator-based VCO is typically limited to 3,000,000,000 Hertz (3 Giga Hz or 3 GHz) and usually has a temperature drift of more than 10,000,000 (10 Mega Hz or 10 MHz) over the temperature range of −40° C. to +85 ° C. The phase noise of the ceramic resonator-based oscillator is usually−120 dBc/Hz at 10 kHz for an operating frequency of 1 GHz (or 1,000 MHz). A surface acoustic wave (SAW) resonator-based oscillator typically offers−135 dBc/Hz at 10 KHz at an operating frequency of 622 MHz and−122 dBc/Hz at 10 KHz for an operating frequency of 2.5 GHz. The typical SAW resonator-based oscillator has a relatively low phase noise, but its performance is very poor over the operating temperature range and it offers a limited number of operating frequency selections.

FIG. 1 is an illustrative schematic diagram of a known oscillator. As FIG. 1 shows, a resonator 10, e.g., a ceramic resonator, is capacitively coupled through capacitor Cc 13 to the base of transistor 16. Feedback capacitor C1 18 is also coupled to the base of transistor 16 and to feedback capacitor C2 19, which is grounded. The values of capacitors C1 18 and C2 19 are preferably adjustable. The emitter terminal of transistor 16 is grounded through inductor Lc 23. The collector terminal of transistor 16 is biased through inductor L0 26 with DC voltage supply Vcc 29. A resistor R2 33 is coupled across the base of the transistor to an inductor L0 26. An additional resistor R1 35 is coupled to voltage supply Vcc and grounded through capacitor C0 37. In this arrangement the ratio of the resistors R2 33 and R1 35 are selected so as to provide temperature stabilization during operation. An output signal may be capacitively coupled from the collector at Vo1. The output signal at Vo1 provides better isolation but poor phase noise performance. For less isolation but better phase noise performance an output Vo2 may be capacitively coupled from the emitter of the transistor. In addition, the output signals Vo1 or Vo2 are non-sinusoidal as they include the fundamental frequency plus the harmonics. As previously discussed, the phase noise performance of oscillators of this type are typically−120 dBc/Hz at 10 kHz for an operating frequency of 1 GHz and the frequency drift is typically 10 MHz over−40° C. to+85° C.

Of utility then are resonator-based oscillators, e.g., VCOs, that provide ultra low noise and low thermal drift performance along with an extended frequency range of operation.

SUMMARY OF THE INVENTION

One aspect of the present invention is an ultra low noise, low thermal drift and extended frequency range high Q resonator-based oscillator. The phase noise of the oscillator is better than−130 dBc/Hz at 10 KHz for an operating frequency of 1 GHz. In accordance with the present invention, the oscillator maintains this noise performance over an operating temperature range of−40 ° C. to+85° C. and thermal drift of 6 MHz to 0.8 MHz over the operating temperature range.

In accordance with another aspect of the present invention an oscillator is provided, the oscillator preferably comprises a three terminal device and first circuitry coupled across a first terminal and a second terminal of the three terminal device and operable to bias the three terminal device and to feedback a select amount of phase noise generated by the three terminal device into the three terminal device so as to reduce a proportional amount of phase noise present at a third terminal of the three terminal device.

The oscillator may further desirably include second circuitry coupled across the second terminal and the third terminal of the three terminal device and operable to control the thermal drift of the three terminal device during operation of the oscillator.

Further in accordance with this aspect of the present invention the oscillator further desirably comprises a resonator coupled to the second terminal and operable to provide an input to the three terminal device. Most preferably the resonator comprises a ceramic resonator, although any high-Q resonator may be used.

In addition, the terminal device most preferably comprises a bipolar transistor and wherein the first, second and third terminals of the three terminal device respectively comprise the collector, base and emitter nodes of the bipolar transistor. On the other hand, the three terminal device may comprise a field effect transistor and wherein the first, second and third terminals of the three terminal device respectively comprise the collector, base and emitter nodes of the field effect transistor. As a general matter, the three terminal device desirably includes any three terminal device which is operable to provide a 180 degree phase shift between the first and second terminals.

Further in accordance with this aspect of the present invention, the oscillator further comprises a first filter and a second filter coupled in series to the third terminal of the three terminal device. It is further desirable that the first and second filters each include a time constant that is adjusted to a fundamental frequency of operation. Most preferably, the first filter comprises an LC filter with a time constant adjusted to a fundamental frequency of operation and the second filter comprises an RC filter with a time constant adjusted to a fundamental frequency of operation. The first filter may be further desirably coupled to the second filter through an inductor.

Further still in accordance with this aspect of the present invention, the oscillator further preferably includes a resonator and tuning sub-circuit coupled to the second terminal and operable to select different operating frequencies for the oscillator.

In addition, the second circuitry may desirably comprise a first feedback capacitor coupled to the second terminal, a temperature compensation resistance coupled to the first feedback capacitor and the third terminal and a second feedback capacitor coupled between the first feedback capacitor and the temperature compensation resistance and to ground.

The first circuitry of the oscillator further desirably maintains a substantially constant bias voltage at the first terminal of the three terminal device over the operating temperature range of the oscillator. Further still in accordance with this aspect of the present invention, the oscillator may further desirably include a pair of resonators coupled in parallel to the second terminal and operable to provide an input to the three terminal device.

In accordance with yet another aspect of the present invention, circuitry for a resonator-based oscillator is provided. In one embodiment the circuitry comprises a transistor having a base, collector and emitter. A bias and temperature compensation network is desirably coupled across the collector and base of the transistor. A feedback capacitor is also coupled to the base of the transistor. A resistor is preferably coupled across the feedback capacitor and the emitter of the transistor to reduce thermal drift during operation. A resonator is capacitively coupled to the base of the transistor and the absolute values of the first and second resistors are desirably chosen so that a select amount of phase noise is fed into the base of the transistor, the select amount of phase noise being sufficiently out of phase with phase noise present at the emitter. Most preferably, the phase noise that is fed-back into the base terminal is approximately 180° out of phase with the phase noise at the emitter terminal.

In addition, two-stage regenerative filtering is preferably introduced at the emitter terminal to effectively reduce the thermal and shot noise produced by the transistor. Further in accordance with this embodiment, the time constant of each of the filters coupled to the emitter is adjusted to operate at the fundamental frequency of operation. The bias and temperature compensation network preferably includes an inductor coupled in series to a first resistor between the base and the collector. A bias voltage is provided through a second resistor, which is connected between the first resistor and collector inductor to complete the temperature compensation network.

Further in accordance with this aspect of the present invention, a bias voltage is preferably provided to the transistor through the second resistor. In addition, it is also desirable to have the transistor be a bipolar transistor, although a field effect transistor is equally desirable.

Further in accordance with this aspect of the present invention, an output signal is taken between the first and second filters coupled to the emitter.

In an additional aspect to the present invention, oscillator circuitry including a transistor having a base, collector and emitter is provided. The circuitry further comprises a bias and temperature compensation network coupled across the collector and base of the transistor and a feedback capacitor and thermal drift compensating network coupled across the base and emitter of the transistor. In addition, a two-stage regenerative filter is preferably coupled to the emitter terminal. The circuitry also includes a ceramic resonator, or any high-Q resonator, that is capacitively coupled to the base of the transistor. Further in accordance with this embodiment a tuning network is capacitively coupled to the resonator for selecting the oscillation frequency of the circuitry.

Further in accordance with this aspect, the time constant of each of the filters coupled to the emitter is adjusted to operate at the fundamental frequency of operation of the oscillator frequency.

A variant of this embodiment includes the addition of a second resonator that is capacitively coupled in parallel to the first resonator.

In accordance with another aspect of the present invention a push-push oscillator circuit arrangement is provided. The push-push oscillator circuitry comprises a pair of series coupled resonators that are coupled to a pair of oscillator sub-circuits. Each oscillator sub-circuit comprises a three terminal device, a bias and temperature network, a feedback capacitor and thermal drift compensating network and regenerative stage filtering preferably arranged in accordance with the previously described embodiments. In addition, a phase coupling network is coupled across both oscillator sub-circuits so as to combine the output signals of each oscillator sub-circuit. In accordance with this aspect of the invention, the output signals of each of the oscillator sub-circuits are out of phase by 180° such that the phase coupling network constructively adds the second harmonic components while canceling the lower-order harmonics. In this way, an ultra-low noise, low thermal drift signal operating at the second harmonic frequency is produced and available over a wide frequency range.

In accordance with a further embodiment, the push-push oscillator circuit is generalized to an N-push configuration which produces an ultra-low noise, low thermal drift signal operating at the N-times the fundamental frequency of the constituent oscillator circuits.

Although the invention is particularly advantageous when used in connection with transistors, other three-terminal devices may be used in accordance with the teachings of the present invention. Bipolar and field effect transistors may also be used to achieve the benefits of the present invention.

In another aspect, the present invention includes a voltage controlled oscillator comprising a first three-terminal device having first, second and third terminals and a second three-terminal device having first, second and third terminals and coupled to the first three-terminal device by a plurality of resonators coupled in series. The voltage controlled oscillator further desirably includes first circuitry coupled between each of the second and third terminals of each of the first and second devices to control the thermal drift of each of the devices and second circuitry coupled between each of the first and second terminals of each of the first and second devices, the second circuitry being operable to maintain a sufficient fixed bias voltage condition at each of the first terminals.

Further in accordance with this aspect of the present invention, a phase coupling network is desirably connected between the first terminals of each of the devices and in parallel with the second circuitry, the phase coupling network being operable to produce an output at a harmonic of the fundamental frequency of the oscillator.

In yet a further aspect, the present invention is a network communication device which desirably includes a phase lock loop for generating a clock signal used to transmit or recover information communicated from or to the device. Most preferably, the phase lock loop includes a voltage controlled oscillator for generating the clock signal. In accordance with this aspect of the present invention, the voltage controlled oscillator comprises a three terminal device; first circuitry coupled across a first terminal and a second terminal of the three terminal device and operable to bias the three terminal device and to feedback a select amount of phase noise generated by the three terminal device into the three terminal device so as to reduce a proportional amount of phase noise present at a third terminal of the three terminal device; and second circuitry coupled across the second terminal and the third terminal of the three terminal device and operable to control the thermal drift of the three terminal device during operation of the oscillator.

In yet a further aspect, the present invention is a cellular telephone that desirably includes a phase lock loop for generating a clock signal used to transmit or recover information communicated from or to the cellular telephone. Most preferably, the phase lock loop includes a voltage controlled oscillator for generating the clock signal. In accordance with this aspect of the present invention, the voltage controlled oscillator comprises a three terminal device; first circuitry coupled across a first terminal and a second terminal of the three terminal device and operable to bias the three terminal device and to feedback a select amount of phase noise generated by the three terminal device into the three terminal device so as to reduce a proportional amount of phase noise present at a third terminal of the three terminal device; and second circuitry coupled across the second terminal and the third terminal of the three terminal device and operable to control the thermal drift of the three terminal device during operation of the oscillator.

Further in accordance with the present invention, a method for generating an ultra-low noise, thermally stable relatively high frequency signal from a VCO is provided. The method comprises providing a three terminal device having first, second and third terminals. The method further includes coupling bias and temperature compensation circuitry across the first and second terminals of the device and coupling a feedback capacitor and thermal-drift circuitry across the second and third terminals of the device. Further in accordance with the method two-stage regenerative filtering is coupled to the third terminal of the device. A resonator is also capacitively coupled to the device's second terminal.

In one aspect of the method, the bias and temperature compensation circuitry comprises supplying a DC bias voltage to the first terminal of the device through a first resistor and an inductor and coupling a second resistor between the first resistor and inductor and the second terminal of the device. In accordance with this aspect, the method further includes selecting the absolute values of the first and second resistors to bias the three terminal device while feeding back a select amount of noise into the second terminal of the device.

The method may further desirably include capacitively coupling a tuning network to the resonator.

A variant to the method includes implementing a bias and temperature compensation network that increases the gain of the feedback into the second terminal.

DETAILED DESCRIPTION OF THE PREFERRED EMBODIMENTS

Figure 1:
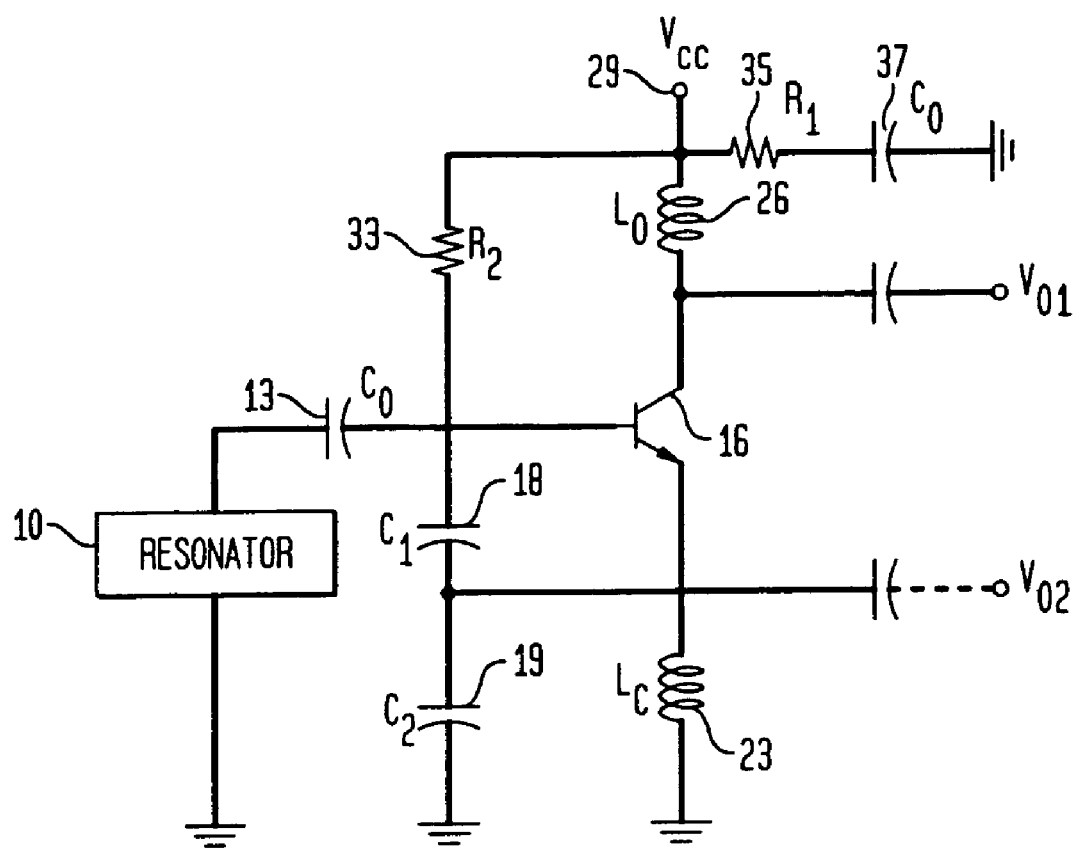
FIG. 1 is a schematic diagram of a known oscillator.
Figure 2:
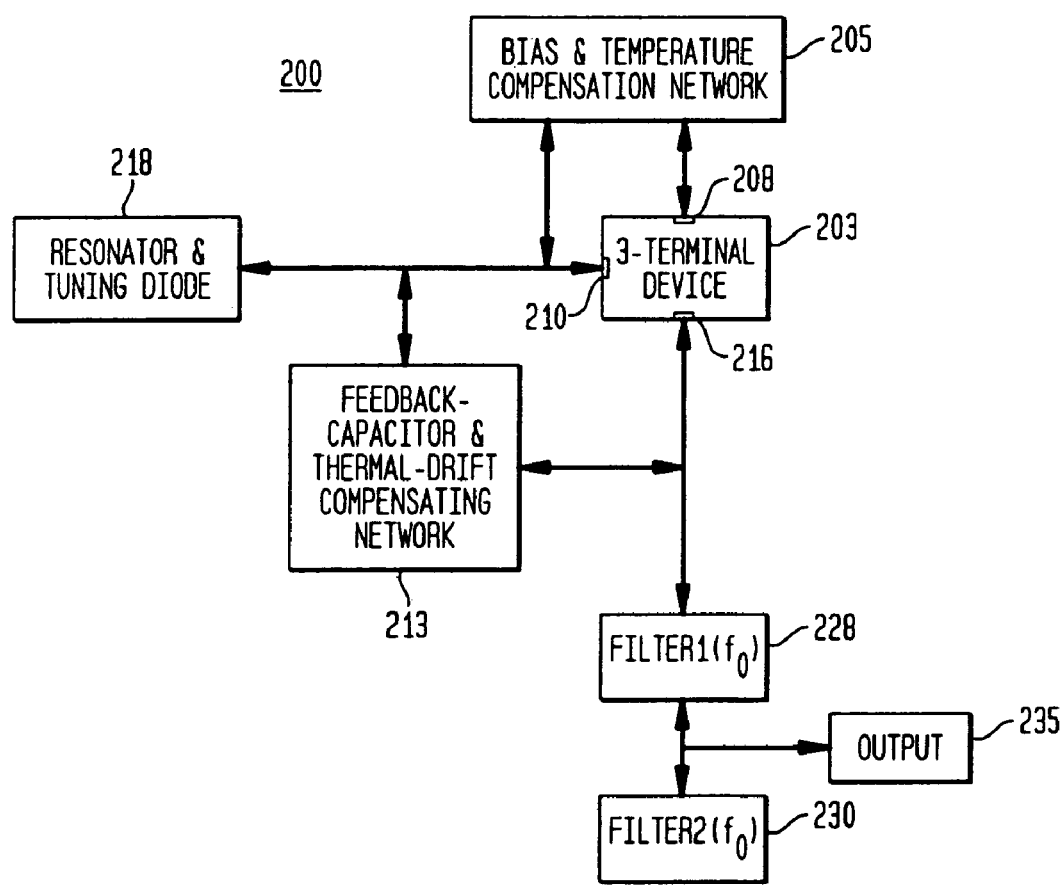
FIG. 2 is a block diagram of an oscillator in accordance with an aspect of the present invention.

FIG. 2 is a block diagram that illustratively depicts the modules of an oscillator circuit 200 in accordance with an aspect of the present invention. As the figure shows, a three terminal device 203 has a bias and temperature compensation network 205 coupled between the first and second terminals, 208 and 210 respectively. The three terminal device 203 may be a bipolar transistor or field effect transistor (FET) or any other three terminal device. In particular, any three-terminal device that can provide a 180° phase shift between first and second terminals 208 and 210 and that supplies sufficient gain at the frequency of operation may be used in accordance with the present invention. In addition, it is also desirable that the maximum operating frequency of the three terminal device be a multiple, such as about ten times, higher than the required frequency of operation.

A thermal drift compensating and feedback network 213 is coupled across the second terminal 210 and third terminal 216. The elements of the network 213 are selected so as to provide thermal stability over the operating temperature range.

The bias and temperature compensation network 205 operates to keep the bias voltage appearing at the first terminal 208 constant. As such, temperature variations that may occur during operation tend not to influence the operation of the three terminal device 203.

A resonator and tuning sub-circuit 218 is also coupled to the second terminal 210. The sub-circuit 218 is used to select different operating frequencies at which the circuit 200 oscillates.

First filter 228 and second filter 230 are series coupled to the third terminal 216 to provide two-stage filtering of the output signal 235.

In accordance with an aspect of the present invention, the network 205 is selected so as to feedback a select amount of the phase noise produced by the three terminal device 203 into the base of the device 203, thereby reducing or canceling a proportional amount of the phase noise present at the third terminal 216 or the output 235.

In operation, the oscillator 200 of FIG. 2 preferably operates in the following manner. The resonator and tuning diode block 218 is tuned to provide an input signal of a select frequency to the second terminal 210. The bias and temperature compensation network 205 is operable to provide a predetermined voltage at first terminal 208. Once the three-terminal device 203 is properly biased it outputs a signal onto third terminal 216 that depends on the frequency of the input at terminal 210, as well as the values of the elements that comprise the bias and temperature compensation network 205 and the feedback-capacitor and thermal-drift compensating network 213. As previously discussed, the values of the elements of bias and temperature compensation network 205 are selected to maintain a substantially constant bias voltage at first terminal 208, as well as feedback a select amount of phase noise into the second terminal 210 of the device 203. The phase noise fed back via the network 205 is most preferably out of phase with the phase noise present at the third terminal 216, and therefore, compensates for changes in the operating temperature range of the device 203 or the temperature range of the operating environment. In addition, feedback-capacitor and thermal-drift compensating network 213 feeds back a select amount of the phase noise present at third terminal 216 into the second terminal 210 to compensate for changes in the output frequency that may be caused by thermal drifting in the device 203. The two-stage filtering provided by filters 228 and 230 is configured to reduce the noise spectral density of the device 203. As such, the device 203 oscillates at frequencies based on the settings of resonator and tuning diode block 218 and advantageously compensates for changes in the operating temperature via network 205, as well as thermal drifting via network block 213.

Figure 3:
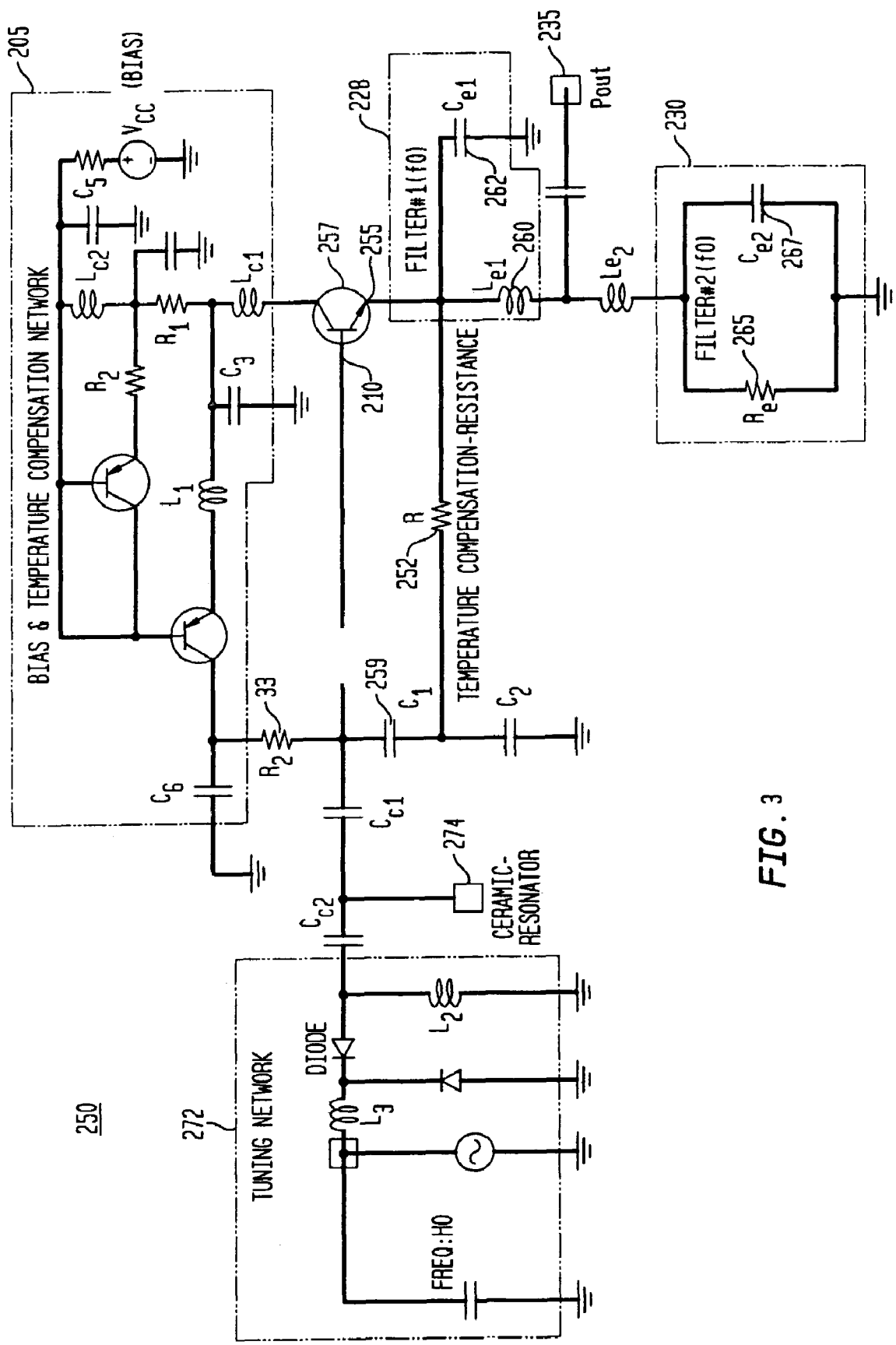
FIG. 3 depicts a circuit diagram of an oscillator of FIG. 2 in accordance with an aspect of the present invention.

Turning now to FIG. 3, there is depicted an embodiment 250 of the oscillator circuit of FIG. 2 in accordance with an aspect of the present invention. As FIG. 3 shows, a temperature compensating resistor 252 is connected across the emitter 255 of a transistor or three terminal device 257 and the feedback capacitor 259. A purpose of resistor 252 is to minimize the thermal drift of the oscillator during operation. The first filter 228 comprises an LC filter network including inductor 260 and capacitor 262. The first filter 228 operates to filter the higher harmonics signals produced by the transistor. The second filter 230 comprises an RC network that includes resistor 265 and capacitor 267. The second filter 230 operates to filter the thermal shot noise of the device 257. The time constant of the first and second filters is adjusted to the fundamental frequency of operation. This regenerative two stage filtering effectively reduces the noise power spectral density that is created by the thermal and shot noise currents of the device 257. The output signal 235, as previously discussed, is taken at a point between the filters.

In the particular embodiment of FIG. 3 the bias and temperature compensation network 205 comprises a number of elements arranged in the manner shown. The network 205 determines the DC operating condition of the device. In addition, the network 205 also acts to feedback a select amount of the phase noise of the transistor through the resistor 33 into the base 210 of the transistor.

A tuning network 272 is coupled to the resonator 274 and is used for adjusting the output of the circuit and compensating for any residual thermal drifting not eliminated by resistor 252 and capacitor 259.

Figure 4:
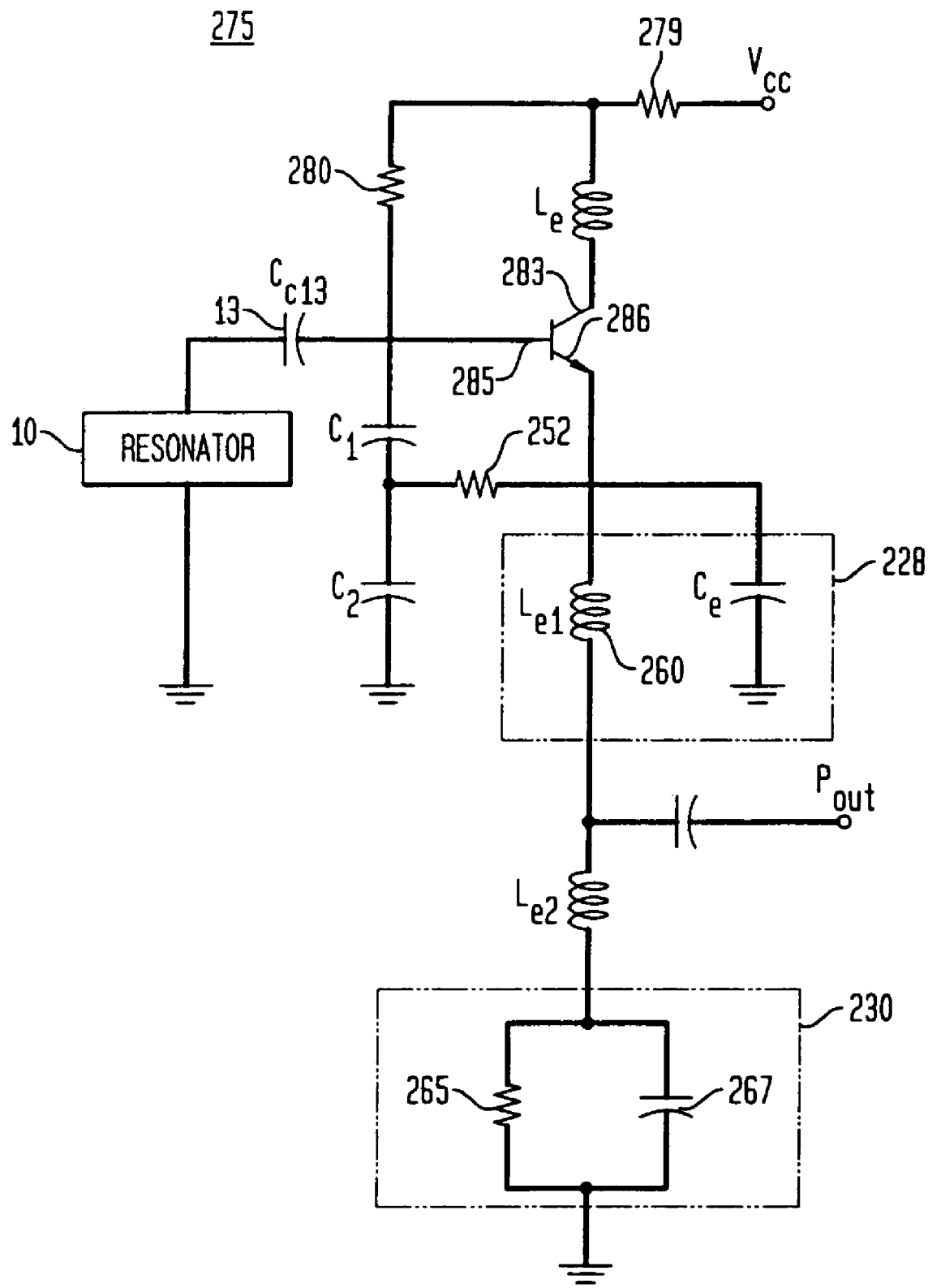
FIG. 4 depicts a circuit diagram of an oscillator of FIG. 2 in accordance with an aspect of the present invention.

FIG. 4 schematically depicts another embodiment 275 of an oscillator in accordance with an additional aspect of the present invention. In particular, first and second filters 228 and 230 are coupled to the emitter output as shown in FIG. 3 and described above. In addition, thermal compensation resistor 252 is also coupled across the feedback capacitor 259 and emitter 255. However, the embodiment of FIG. 4 does not include a tuning network, e.g., tuning network 272, and a temperature compensation network, e.g., temperature compensation network 205. In accordance with FIG. 4 the absolute values of the resistors 279 and resistor 280 may be chosen so as to reduce the phase noise at the emitter. In accordance with an aspect of the invention, the proper selection of the values of resistors 279 and 280 will result in noise being fed back from the collector 283 into the base 285 of the transistor. Because the noise fed back into the base 285 would be of an opposite phase to the noise out of the emitter 286, a reduction in phase noise is produced at the output port.

The exact values of resistors 279 and 280 (or 33 and 35) determine the DC bias of the three terminal device. Preferably, the set of absolute values for these resistors are set so as to provide the same bias while minimizing the phase noise performance of the circuitry. These two resistors may also be replaced by a more complex electronic circuit with higher feedback gain as shown in FIG. 3.

Figure 5:
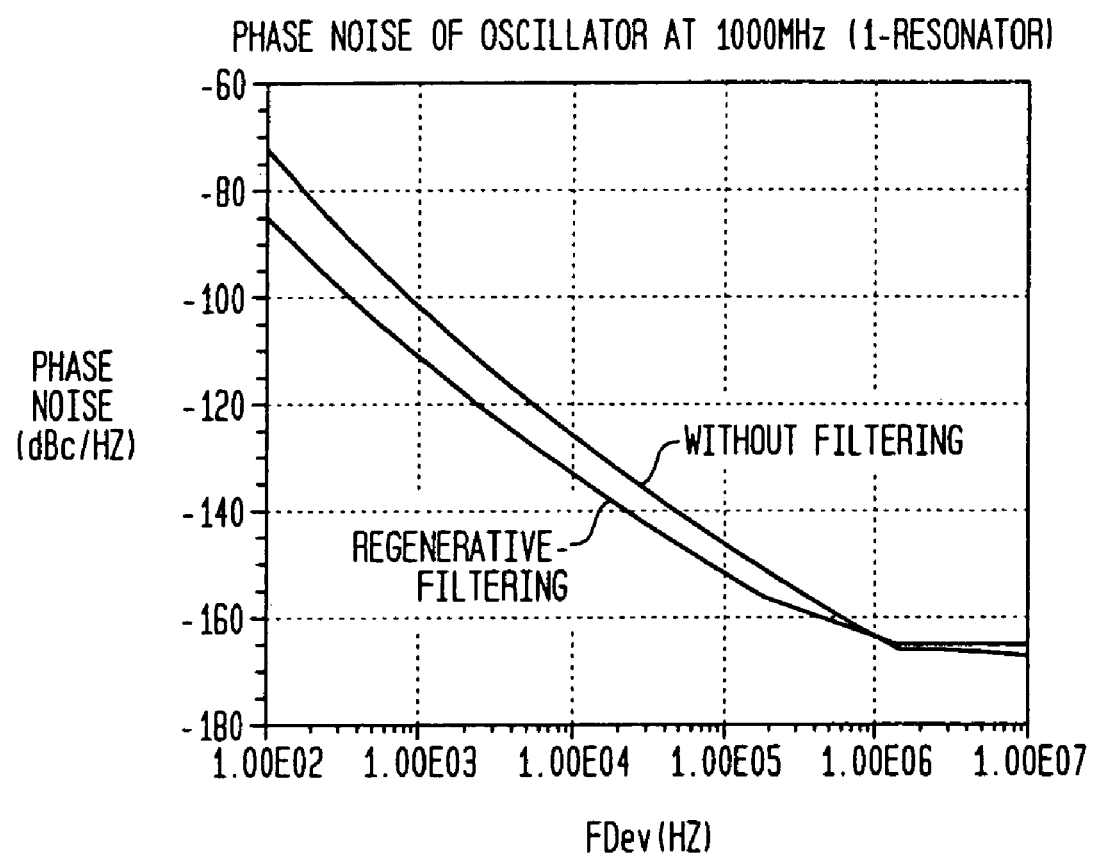
FIG. 5 illustrates the phase noise performance of an oscillator operating in accordance with an aspect of the present invention.

Turning now to FIG. 5, there is shown a plot of the measured phase noise of an oscillator operating in accordance with an aspect of the present invention. The oscillator was tuned to an operating frequency of 1 GHz and measurements were taken with and without regenerative filtering. With regenerative filtering the phase noise was approximately −130 dBc/Hz at 10 KHz. Without regenerative filtering the phase noise was slightly less at approximately −125 dBc/Hz. Thus, even without regenerative filtering improvement in the phase noise, performance of a resonator-based oscillator may be achieved in accordance with the foregoing aspects of the present invention.

Figure 6:
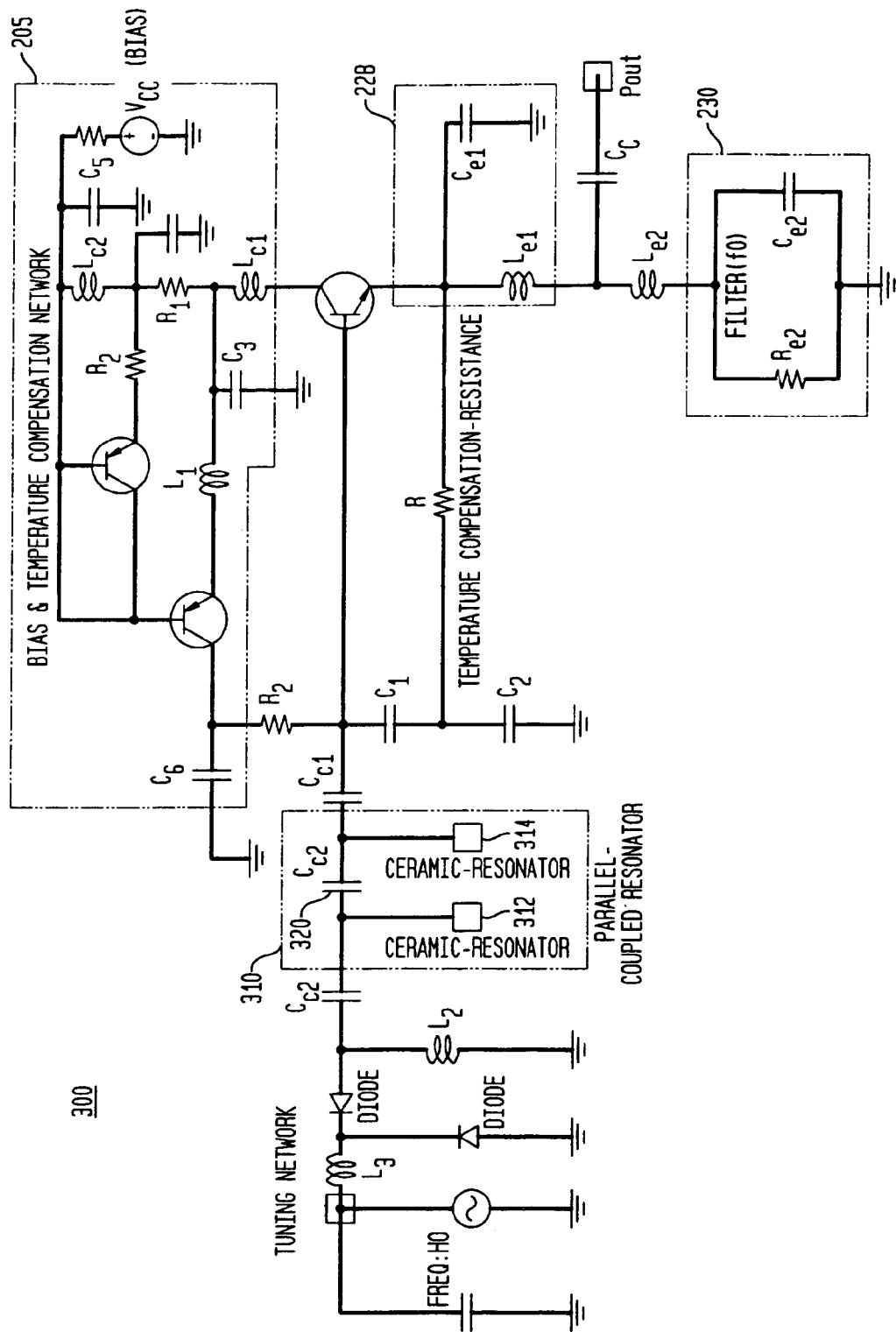
FIG. 6 is a schematic diagram of an oscillator in accordance with an aspect of the present invention.

FIG. 6 is a schematic diagram illustrating a parallel-coupled resonator oscillator 300 in accordance with an additional aspect of the present invention. As shown by block 310, the oscillator 300 includes a pair of parallel-coupled resonators. Otherwise, the circuitry includes all the same functional elements of FIGS. 2 and 3. The resonators 312 and 314 are connected in parallel across capacitor 320. By appropriately capacitively coupling the resonators across the capacitor 320, the phase noise performance of the oscillator may be improved. The parallel arrangement of FIG. 6 results in a single tuned circuit that does not increase the noise performance of the circuit. The arrangement of FIG. 6 may also improve performance by approximately 10 to 20 dB over the single resonator oscillator circuit phase noise described hereinabove.

Figure 7:
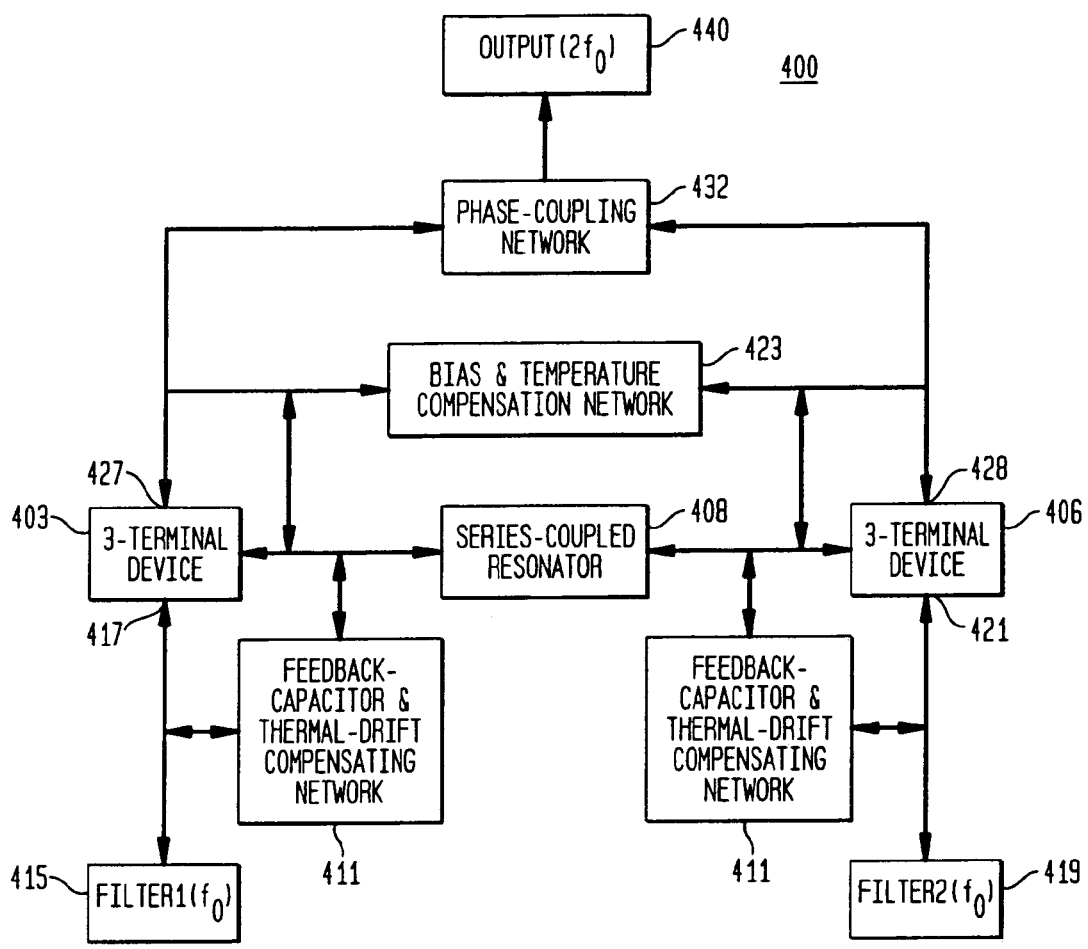
FIG. 7 is block diagram of an oscillator in accordance with an aspect of the present invention.

FIG. 7 illustratively depicts the functional modules and their arrangement in a push-push topology to form a series coupled resonator oscillator 400 in accordance with another aspect of the present invention. In accordance with this aspect of the present invention, a first three-terminal device 403 and a second three-terminal device 406 are coupled in a back-to-back configuration by a plurality of series coupled resonators 408. The devices 403 and 406 are each coupled to a feedback-capacitor and thermal drift compensating network 411. A first filter 415 that operates at the fundamental frequency of the circuit is coupled to a second terminal 417 of the first device 403. A second filter 419 that also operates at the fundamental frequency of the circuit is coupled to a second terminal 421 of the second device 406. A bias and temperature compensation network 423 is coupled to the third terminals 427 and 428 of the devices 403 and 406, respectively. A phase coupling network 432 is also coupled to third terminals 427 and 428 in parallel with bias and temperature compensation network 423. The output 440 of the circuit is connected to the phase coupling network 432 and operates at multiples of the fundamental frequency of the circuit depending on the number of resonators that are coupled in series. For example, where two resonators are coupled in series the output is twice the fundamental frequency of the circuit.

Figure 8:
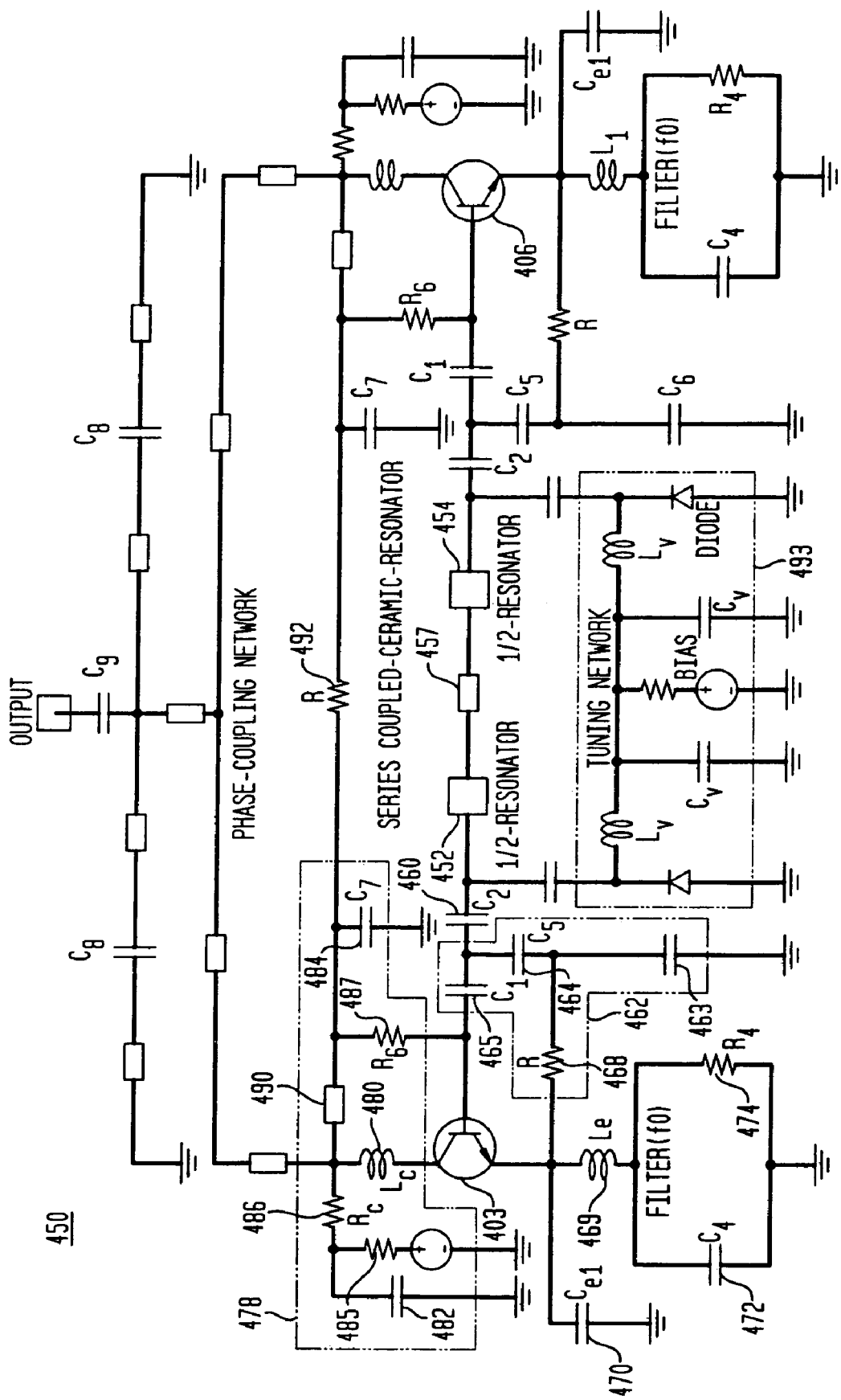
FIG. 8 is a schematic diagram depicting an embodiment of an oscillator in accordance with the functional diagram of FIG. 7.

Turning now to FIG. 8, there is shown a schematic diagram for an embodiment of an oscillator 450 in accordance with the push-push arrangement of FIG. 7. In particular, the oscillator 450 consists of a pair of series coupled ceramic resonators 452 and 454. The resonators are coupled in series through a portion of transmission line 457. As shown, the resonators 452 and 454 behave as two half-wave resonators. Physically, the resonators 452 and 454 are formed from a single common resonator that is tapped so to provide oscillating signals that are 180 degrees out of phase.

The first resonator 452 is capacitively coupled by capacitor 460 to a first feedback and thermal compensating network 462. The network 462 includes feedback capacitors 463, 464 and 465 and temperature compensation resistance 468. Similar to the arrangement of FIG. 3, temperature compensation resistance 468 is coupled across capacitor 464 and the emitter of the first three terminal device 403, which is shown as a transistor. As previously discussed the transistor 403 may comprise a bipolar transistor or FET. Two stage regenerative filtering is again implemented at the emitter with the first LC filter comprising inductor 469 and capacitor 460. The second RC filter is formed by capacitor 472 and resistor 474.

A first bias and temperature compensation network 478 is coupled across the base and collector of the device 403. The network 478 comprises the inductor 480 coupled to the collector of the transistor 403 along with capacitors 482, 484, resistors 485, 486 and 487, bias DC voltage supply 489 and a transmission line 490. The first bias and compensation network 478 is coupled via resistor 492 to the bias and compensation network of the second transistor 406. In accordance with the present embodiment, and as shown in FIG. 8, the second transistor 406 is coupled to the second resonator 454 in a symmetrical circuit arrangement as the first transistor 403 is coupled to the first resonator 452.

The arrangement of transistors 403 and 406 and their sub-circuits (e.g., bias and compensation network, feedback and thermal drift network) of FIG. 8 extends the frequency operation of the single resonator arrangement of FIG. 3 by a factor of two while providing ultra-low phase and low thermal drift performance. In accordance with the embodiment of FIG. 8, two duplicates of the oscillation signals that are out of phase by 180° are produced at the collector terminal of each transistor. The phase coupling network then combines each of the signals produced by each transistor and sub-circuit arrangement to produce a signal at the second harmonic of fundamental frequency of the circuit.

The embodiment further includes an optional phase tuning network 493 that is capacitively connected via capacitors 497 and 498 across the resonators. The tuning network 493 is used to fine-tune the phase difference between the signals from the resonators and, in turn, the phase difference between the signals produced by the oscillator circuitry.

For the 2-push oscillator configuration shown in FIG. 8, the anti-symmetric phase between the two oscillators is 180 degrees. The two symmetrical oscillators sub-circuits coupled through a common high Q resonator (e.g., ceramic resonator) forces the output collector current of the two sub-circuits to be 180-degrees out of phase and this creates a differential voltage across the resonator, which is connected through base of the transistors of the two circuits. Since the two-oscillator sub-circuit is symmetrical, it develops the virtual RF ground in the center of the ceramic resonator and the base current of the two sub-circuits in the direction of the resonator are in the opposite phase. The virtual RF-grounding in the middle of the ceramic resonator divides the resonator into two symmetrically halves and this results in the doubling of the SRF (self-resonant frequency), and thereby, the single resonator is treated as a two-halves series coupled resonator.

Figure 9:
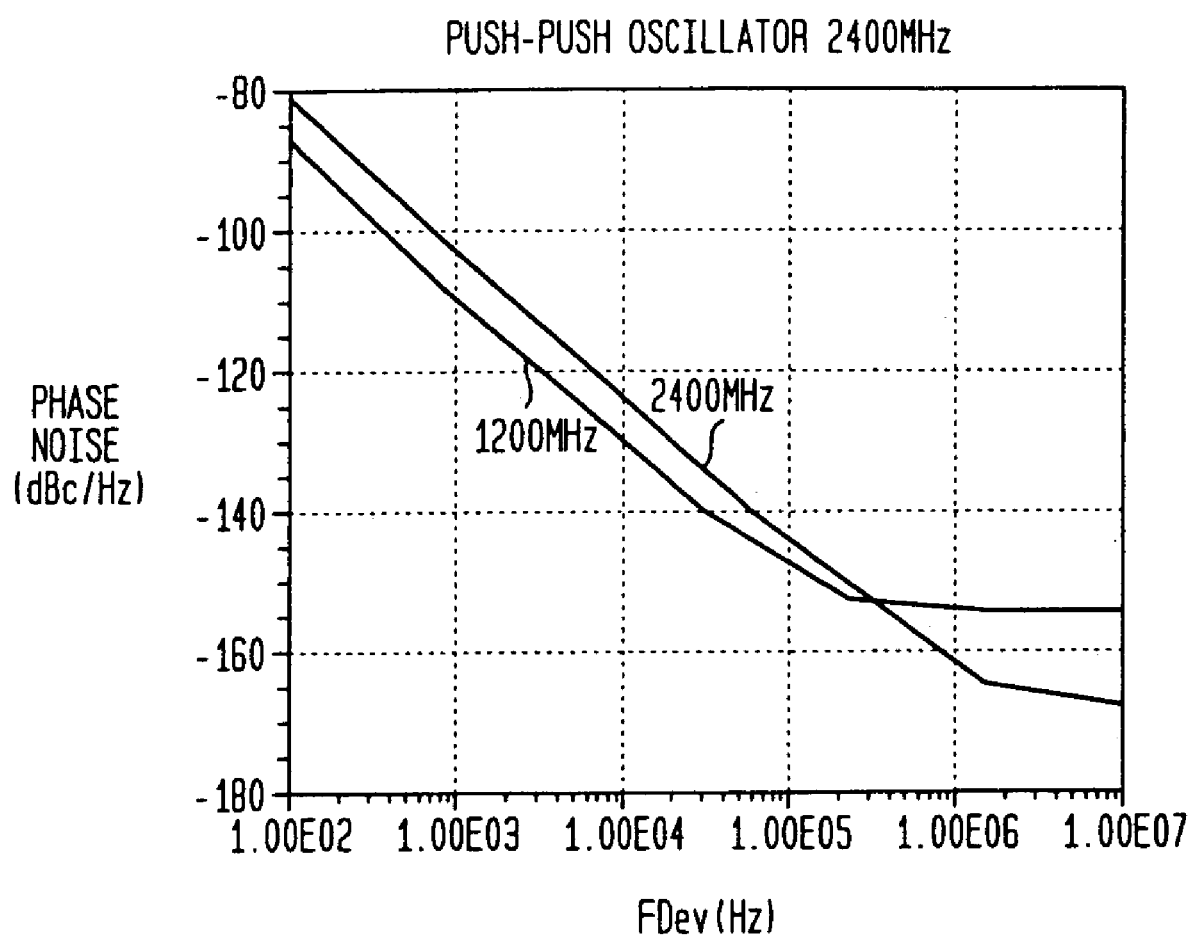
FIG. 9 illustrates the phase noise performance of an oscillator operating in accordance with the circuitry of FIG. 8.

FIG. 9 illustrates the phase noise performance of the push-push configuration of FIG. 8. At an operating frequency of 2.4 GHz the push-push resonator provides approximately –125 dBc/Hz of phase noise at 10 KHz. In addition, the phase noise is approximately –130 dBc/Hz at 10 KHz for an operating frequency of 1.2 GHz.

Figure 10:
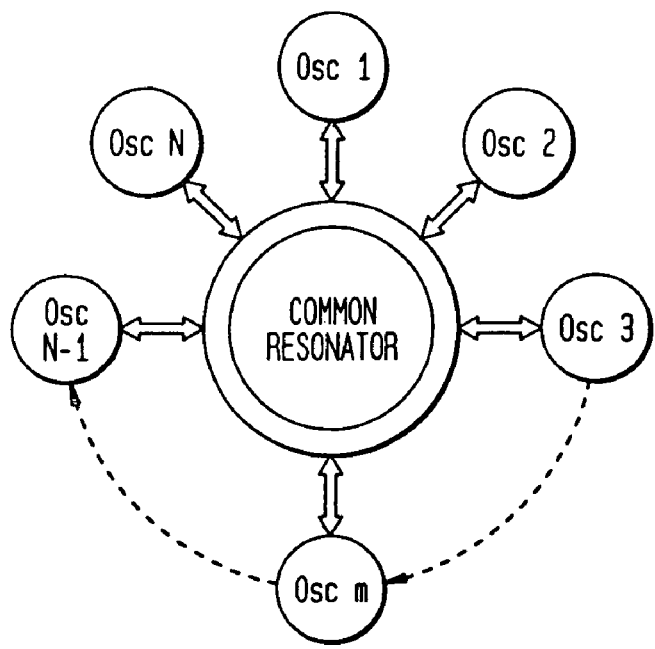
FIG. 10 illustratively depicts the topology for an N-push oscillator in accordance with an aspect of the present invention.

The push-push or 2-push arrangement of FIG. 8 can be extended to provide oscillators operating at frequencies up to N times the fundamental frequency of the oscillator circuitry by series coupling an array of N transistor oscillator sub-circuits. In particular, and as is illustratively depicted in FIG. 10, N-adjacent sub-circuits may be coupled to share a common resonator so as to produce N duplicates of the oscillation signal that are out-of-phase by 360°/N. The N duplicates may be then combined in a manner shown in FIGS. 8 and 9 to produce the desired harmonic while canceling the undesired harmonics due to the symmetry of the signal phases.

Figure 11:
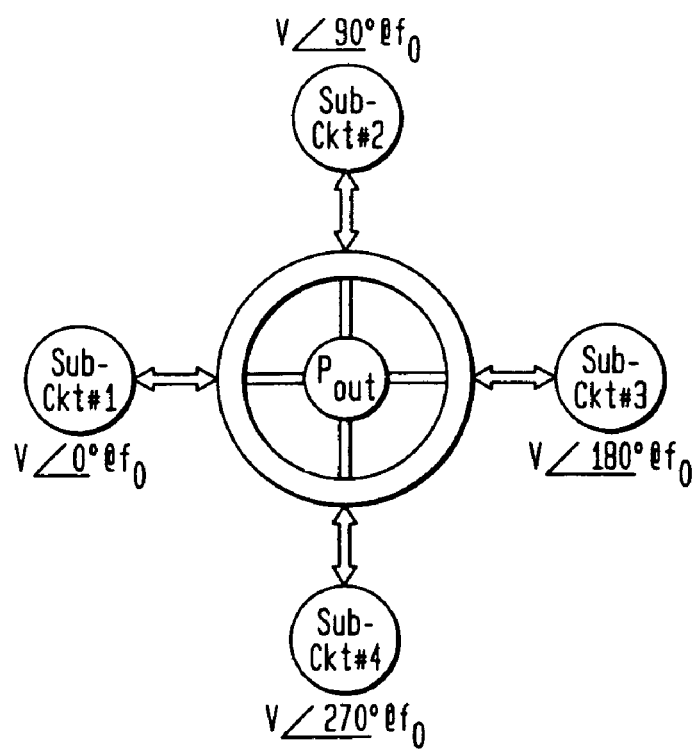
FIG. 11 illustratively depicts the topology for a 4-push oscillator in accordance with an aspect of the present invention.

FIG. 11 illustratively depicts the topology for a 4-push oscillator in accordance with yet another aspect of the present invention. For a 4-push oscillator, adjacent sub-circuits are 90 degrees out of phase and simultaneously oscillate in a mutual injection mode. The oscillating signal from a neighboring sub-circuit is injected to another sub-circuit and further again is injected to the other ones, and so on, such that all the sub-circuits can oscillate in the same fundamental frequency ($f_0$). As it can be seen from the mathematical expression below, the fundamental oscillating signal of each sub-circuit has a phase difference of 90 degrees, 180 degrees and 270 degrees to that of the others The time varying oscillating signals of each sub-circuit for 4-push oscillator can be given as:

$$V_1(t) = K_0 e^{j\omega_0 t} + K_1 e^{j2\omega_0 t} + K_2 e^{j3\omega_0 t} + K_3 e^{j4\omega_0 t} + K_4 e^{j5\omega_0 t} + \ldots$$

$$V_2(t) = K_0 e^{j(\omega_0 t - \frac{\pi}{2})} + K_1 e^{j2(\omega_0 t - \frac{\pi}{2})} + K_2 e^{j3(\omega_0 t - \frac{\pi}{2})} + K_3 e^{j4(\omega_0 t - \frac{\pi}{2})} + K_4 e^{j5(\omega_0 t - \frac{\pi}{2})} + \ldots$$

$$V_3(t) = K_0 e^{j(\omega_0 t - \pi)} + K_1 e^{j2(\omega_0 t - \pi)} + K_2 e^{j3(\omega_0 t - \pi)} + K_3 e^{j4(\omega_0 t - \pi))} + K_4 e^{j5(\omega_0 t - \pi)} + \ldots$$

$$V_4(t) = K_0 e^{j(\omega_0 t - \frac{3\pi}{2})} + K_1 e^{j2(\omega_0 t - \frac{3\pi}{2})} + K_2 e^{j3(\omega_0 t - \frac{3\pi}{2})} + K_3 e^{j4(\omega_0 t - \frac{3\pi}{2})} + K_4 e^{j5(\omega_0 t - \frac{3\pi}{2})} + \ldots$$

$$[V_{out}(t)]_{4-Push} = \sum_{n=1}^{4} V_n(t) = A_1 e^{j4\omega_0 t} + A_2 e^{j8\omega_0 t} + A_3 e^{j12\omega_0 t} + \ldots$$

The desired fourth harmonic signals $4f_0$ are constructively combined for extended frequency operation because of their in-phase relations. However, the undesired fundamental signal $f_0$, the second harmonic signals $2f_0$, the third harmonic signals $3f_0$ and the fifth harmonic signals $5f_0$ are suppressed due to the out of the phase relations from the orthogonal resonance modes of the ring resonators in the 4-push topology.

Generally in accordance with an aspect of the present invention, the N-push improves the phase noise and thermal drift in comparison with the single oscillator by the factor of N.

Figure 12A:
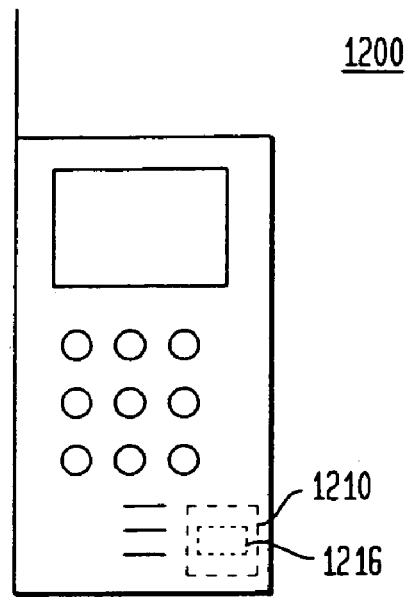
FIGS. 12A and 12B illustratively depict a cellular phone and a communication device in accordance with an aspect of the present invention.
Figure 12B:
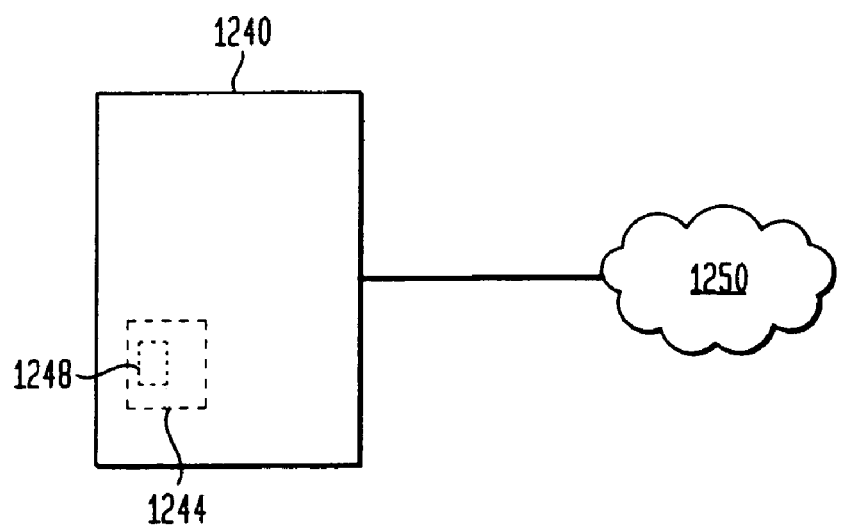

A voltage controlled oscillator in accordance with the present invention may be employed in any number of devices that are used to communicate on a data, telephone, cellular or, in general, communications network. Such devices may include but are not limited to, for example, cellular phones, personal digital assistants, modem cards, lap tops, satellite telephones. As a general matter, the oscillator circuitry shown in the various drawings and described above may be employed in a PLL to either generate a clock signal that may be used to transmit or recover information transmitted or received over a network. FIGS. 12A and 12B illustratively depict a schematic of a cellular phone and a communication device in accordance with additional aspects of the present invention. More particularly, FIG. 12A shows a cell phone 1200 that includes a PLL block 1210 that employs a voltage controlled oscillator 1216. FIG. 12B depicts a communication device 1240 that includes a PLL 1244 and oscillator 1248. The device 1240 is connected to a network 1250 and transmit and receives information over the network 1250. In addition to wireless networks, the circuitry of the present invention may be employed in wired networks, satellite networks, etc.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A voltage controlled oscillator, comprising:
   a transistor having a base, collector and emitter;
   a bias and temperature compensation network including an inductor connected in series with a first resistor between the base and collector of the transistor and a second resistor connected between the first resistor and the inductor;
   a feedback capacitor connected to the base of the transistor;
   a resistor operative to reduce thermal drift of the oscillator connected across the feedback capacitor and the emitter of the transistor;
   a two stage regenerative filter coupled to the emitter; and
   a resonator capacitively connected to the base of the transistor;
   wherein the absolute values of the first and second resistors are such that a select amount of phase noise is fed into the base of the transistor, the select amount of phase noise being out of phase with phase noise at the emitter; and
   wherein the two stage regenerative filter includes a first LC filter inductively coupled to a second RC filter.

2. The oscillator of claim 1, wherein an output signal is taken between the first and second filters.

3. The oscillator of claim 1, wherein a bias voltage is provided to the transistor through the second resistor.

4. Circuitry for a voltage controlled oscillator, comprising:
   a first device having first, second and third terminals;
   bias and temperature circuitry coupled between the first and second terminals;
   resonator and tuning circuitry coupled to the second terminal;
   feedback and thermal-drift compensating circuitry coupled between the second and third terminals;
   a first filter coupled to the third terminal;
   a second filter coupled to the first filter; and
   wherein the first and second filters include a time constant that is adjusted to the fundamental frequency of operation of the circuitry and wherein the bias and temperature circuitry feeds back a select amount of noise into the device.

5. The circuitry of claim 4 wherein the first device comprises a bipolar transistor and the first, second and third terminals comprise the collector, base and emitter nodes, respectively, of the bipolar transistor.

6. The circuitry of claim 4 wherein the first device comprises a field-effect transistor and the first, second and third terminals comprise the collector, base and emitter nodes, respectively, of the field effect transistor.

7. The circuitry of claim 4 wherein the first filter comprises an LC circuit and the second filter comprises an RC circuit and wherein the first and second filters are coupled through an inductor.

8. The circuitry of claim 4 wherein the feedback and thermal-drift compensation circuitry comprises a first feedback capacitor coupled to the second terminal, a temperature compensation resistance coupled to the first feedback capacitor and the third terminal and a second feedback capacitor coupled between first feedback capacitor and the temperature compensation resistance and to ground.

9. The circuitry of claim 4 further comprising a second three terminal device having first, second and third terminals, wherein the second device is coupled to the resonator, the feedback and thermal-drift compensating circuitry and the bias and temperature circuitry and wherein the first and second devices are further coupled to a phase coupling network which combines the first and second devices output signals to produce a signal operating at the second harmonic of the fundamental frequency of operation of the circuitry.

10. The circuitry of claim 4 further comprising a plurality of three terminal devices coupled to the resonator, each of the plurality of three terminal devices being coupled to the feedback and thermal-drift compensating network and the bias and temperature network and wherein the plurality of devices are further coupled to a phase coupling network which combines the first and second devices output signals to produce a signal operating at the Nth harmonic of the fundamental frequency of operation of the circuitry.

11. A system, comprising:
    a first three terminal device having first, second and third terminals;
    a second three terminal device having first, second and third terminals and coupled to the first three terminal device by a plurality of resonators coupled in series;
    first circuitry coupled between each of the second and third terminals of each of the first and second devices to control the thermal drift of each of the devices;
    second circuitry coupled between each of the first and second terminals of each of the first and second devices, the second circuitry being operable to maintain a sufficient fixed bias voltage condition at each of the first terminals; and a phase coupling network connected between the first terminals of each of the devices and in parallel with the second circuitry, the phase coupling network being operable to produce an output at a harmonic of the fundamental frequency of the oscillator.

12. The system of claim 11, further comprising a first and second filters each coupled to the third terminal of the first and second devices and each operating at the fundamental frequency of the oscillator.

13. The system of claim 11, wherein the resonators are coupled in series through a portion of transmission line.

14. The system of claim 11, wherein the plurality of resonators comprise two resonators formed from a single common resonator that is tapped so to provide signals that are 180 degrees out of phase.

15. The system of claim 11, further comprising a phase tuning network coupled across the plurality of resonators, the phase tuning network being operable to adjust the phase difference between the signals of each of the plurality of resonators.

16. The system of claim 11, wherein each of the devices comprise a bipolar transistor.

17. The system of claim 11, wherein each of the devices comprise a field effect transistor.

18. The system of claim 11, wherein each of the devices is operable to provide a 180-degree phase shift between the first and second

* * * * *

UNITED STATES PATENT AND TRADEMARK OFFICE
CERTIFICATE OF CORRECTION

PATENT NO. : 7,545,229 B2
APPLICATION NO. : 11/657363
DATED : June 9, 2009
INVENTOR(S) : Ulrich L. Rohde and Ajay Kumar Poddar It is certified that error appears in the above-identified patent and that said Letters Patent is hereby corrected as shown below:

Column 14, line 12, after "second" insert --terminals--.

Signed and Sealed this

Sixth Day of July, 2010

David J. Kappos
*Director of the United States Patent and Trademark Office*